United States Patent [19]
Dawson et al.

[11] Patent Number: 5,780,847
[45] Date of Patent: Jul. 14, 1998

[54] VERDET CONSTANT TEMPERATURE-COMPENSATED CURRENT SENSOR

[75] Inventors: Jay W. Dawson, Round Rock; Trevor W. MacDougall, Cedar Park, both of Tex.

[73] Assignee: Minnesota Mining and Manufacturing Company, St. Paul, Minn.

[21] Appl. No.: 822,894

[22] Filed: Mar. 24, 1997

Related U.S. Application Data

[63] Continuation of Ser. No. 539,059, Oct. 4, 1995, abandoned.

[51] Int. Cl.$^6$ .............. G02F 1/05; G02F 1/09; G01R 15/00
[52] U.S. Cl. ............... 250/227.17; 250/227.21; 250/225; 385/11; 385/12; 356/351; 324/76.11; 324/96
[58] Field of Search ............ 250/227.17, 227.21, 250/227.24, 227.14, 227, 11, 225; 385/12, 11, 8, 6, 2; 356/351, 365, 366, 367, 368, 364; 324/76.11, 96, 105, 244.1

[56] References Cited

U.S. PATENT DOCUMENTS

| | | | |
|---|---|---|---|
| 4,612,500 | 9/1986 | Chen et al. | 324/96 |
| 4,675,522 | 6/1987 | Arunkumar | 250/227.19 |
| 4,988,212 | 1/1991 | Sun et al. | 250/227.11 |
| 5,008,611 | 4/1991 | Ulmer | 324/96 |
| 5,021,647 | 6/1991 | Tatsuno et al. | 250/227.21 |
| 5,051,577 | 9/1991 | Lutz et al. | 250/227.17 |
| 5,382,901 | 1/1995 | Okajima et al. | 324/244.1 |
| 5,416,860 | 5/1995 | Lee et al. | 385/12 |
| 5,450,006 | 9/1995 | Tatum | 250/227.17 |
| 5,463,312 | 10/1995 | Lutz et al. | 324/96 |
| 5,486,754 | 1/1996 | Cruden et al. | 324/96 |
| 5,553,173 | 9/1996 | Lutz et al. | 385/12 |

FOREIGN PATENT DOCUMENTS

| | | | |
|---|---|---|---|
| 0 657 740 A2 | 6/1995 | European Pat. Off. | G01R 15/24 |
| PCT/GB93/00134 | 1/1992 | WIPO | G01R 15/27 |

OTHER PUBLICATIONS

Article entitled "Development of a Fiber Optic Current Sensor For Power Systems" by Dale R. Lutz, Trevor W. MacDougall, and Robert A. Wandmacher, 3M Co., St. Paul, Minnesota, IEEE Proceedings pp. 336–341 (Feb. 1991).

Article entitled "Temperature dependence of the Verdet constant in several diamagnetic glasses", Applied Optics, vol. 30, No. 10, pp. 1176–1178 (Apr. 1, 1991).

*Primary Examiner*—Edward P. Westin
*Assistant Examiner*—John R. Lee
*Attorney, Agent, or Firm*—Gerald F. Chernivec

[57] ABSTRACT

A fiber optic, Faraday-effect current sensor (optical current transducer) which has improved temperature sensitivity due to compensation for temperature-induced variations of the Verdet constant. Fiber optic sensing coils can exhibit shifts in their bias angle due to a number of reasons, including physical rotation of the fibers, an apparent circular birefringence attributable to the sensing coil shape (Berry's phase), circular birefringence in the sensing fiber, or a DC magnetic field or current. The present invention takes advantage of the change in bias angle by identifying a preferred channel from the two sensing axes of the output fiber, based on the manner in which these axes respond to the change in bias angle. One of the axes will exhibit a change in sensitivity that exacerbates the change in sensitivity due to the Verdet constant, while the other channel will exhibit a change that complements, or compensates for, the change in sensitivity due to the Verdet constant. Once the preferred channel is identified, a polarizing fiber is attached to the output of the sensing coil, aligned to transmit the preferred channel to the optical detector.

20 Claims, 2 Drawing Sheets

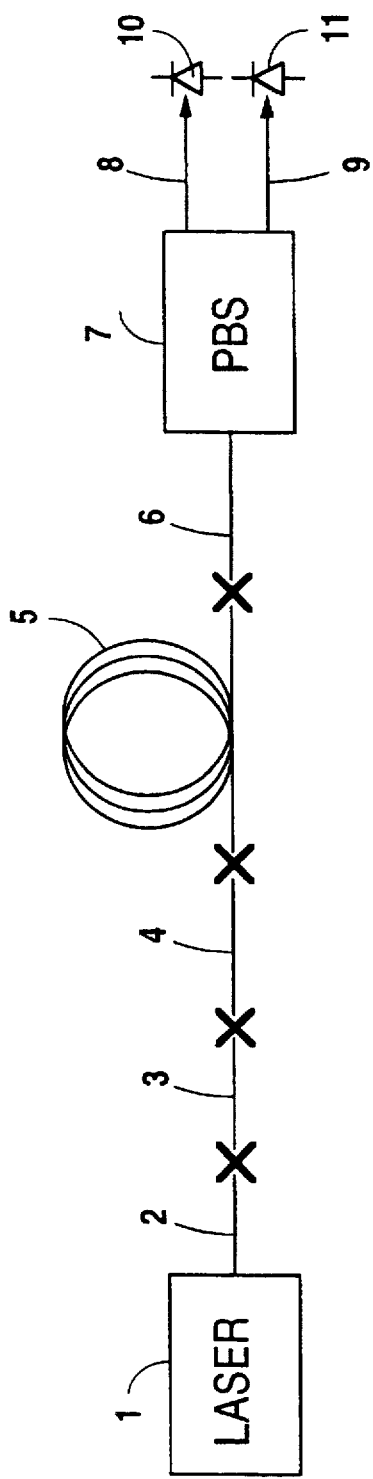
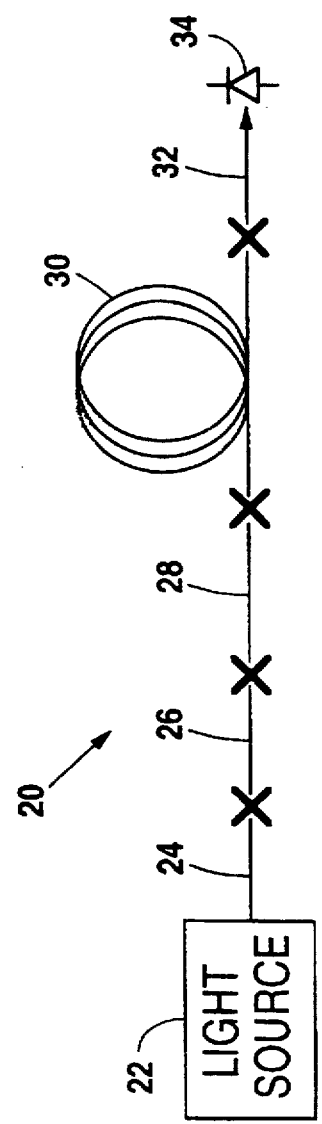

VERDET CONSTANT TEMPERATURE-COMPENSATED CURRENT SENSOR

This is a continuation of application Ser. No. 08/539,059 filed Oct. 4, 1995, now abandoned.

BACKGROUND OF THE INVENTION

1. Field of the Invention

The present invention generally relates to Faraday effect, fiber optic current-sensing coils, and more particularly to an improved sensor which compensates for temperature-induced variations, and a method for making such a sensor.

2. Description of the Prior Art

Optical fibers which are sensitive to magnetic fields are known in the art, and are increasingly being used as optical current transducers (OCT's) for electric power utilities. A typical OCT uses a single-mode fiber formed into a coil surrounding the electrical conductor. The polarization of any light traversing the fiber coil shifts, in response to the change in any current flowing through the conductor, as a result of the magneto-optic Faraday effect, also referred to as Faraday rotation or the Kundt effect. The Faraday effect is the manner in which the polarization of a beam of linearly polarized light rotates when it passes through matter in the direction of an applied magnetic field, and is the result of Faraday birefringence. Faraday birefringence is the difference in the indices of refraction of left and right circularly polarized light passing through matter parallel to an applied magnetic field. Further discussion of field-sensitive optical fibers is provided in U.S. Pat. No. 5,051,577 assigned to Minnesota Mining and Manufacturing Co. (3M—assignee of the present invention).

An exemplary prior art sensor is shown in FIG. 1. A laser 1 feeds a light signal into a first optical fiber 2, which may be a polarization maintaining (PM) fiber, a polarizing (PZ) fiber, or a fiber optic depolarizer aligned with the optical source polarization so as to maximize transmission, spliced to a second optical fiber 3 (which serves as the link between the optical source/electronics and the sensor head) which is in turn spliced to a third, PZ fiber 4 that is connected to the input of a sensing coil 5. If a polarized laser source is used, fiber 2 is a PZ or PM fiber, and fiber 3 may also be either a PZ or PM fiber. If a depolarized laser source is used, fiber 2 is a depolarizing fiber and fiber 3 is a single-mode fiber. Sensing coil 5 may be an annealed fiber, or a non-annealed material such as flint glass. The output of sensing coil 5 is spliced to another PM fiber 6 which terminates in a polarizing beam splitter (PBS) 7. PBS 7 has two outputs 8 and 9, corresponding to the two orthogonal sensing axes of fiber 6, which are coupled to two detectors (photodiodes) 10 and 11, respectively. Changes in the current flowing through the electrical conductor (which is surrounded by coil 5) result in rotation of the polarized signal, affecting the output currents $I_1$ and $I_2$ flowing from detectors 10 and 11, respectively. These currents are measured to determine the change in current flowing through the conductor, typically according to the equation $(I_1-I_2)/(I_1+I_2)$.

Many prior art references recognize that the response of OCT's may vary considerably due to temperature variations, unacceptably so for highly precise OCT's which may be used in environments having widely varying temperature ranges, such as −40° to +80° C. See, for example, U.S. Pat. No. 5,382,901, U.S. patent application Ser. No. 08/205,899, now U.S. Pat. No. 5,463,312, European Patent Application No. 657,740, and "Temperature Dependence of the Verdet Constant in Several Diamagnetic Glasses", Journal of Applied Optics, Vol. 30, No. 10, pp. 1176–1178 (Apr. 1, 1991). The prior art recognizes that temperature effects on a sensing coil relate to three different phenomena: (i) changes in the linear birefringence in the sensing fiber, (ii) changes in linear birefringence due to stresses induced by the materials encapsulating the sensing fiber, and (iii) changes in the Verdet constant of the fiber core material. The Verdet constant is the constant of proportionality V in the equation of the Faraday effect, $\theta=\mu NVI$, where $\theta$ is the angle of rotation of polarization, $\mu$ is the permeability of the fiber core material, N is the number of turns of the encircling fiber loop, and I is the conductor's current. In other words, the Verdet constant is equal to the angle of rotation of plane-polarized light in a substance with an applied magnetic field divided by the product of the length of the light path in the substance and the strength of the applied magnetic field, and is a function of both temperature and wavelength of the light signal.

The prior art system of FIG. 1 does not inherently address changes in the response of the sensor due to temperature-induced changes in the Verdet constant, but several techniques have been devised to compensate for these changes. The primary technique is to simply monitor the temperature and adjust the value of the detector outputs according to empirical data associated with the temperature dependency of the Verdet constant. A more complicated variation of this technique is disclosed in U.S. Pat. No. 5,416,860. That system requires not only additional electronic processing, but also requires additional opto-electronic components, which generally increase the cost of the unit. Another technique is described in U.S. Pat. No. 5,450,006, and similarly requires additional components, such as a Michelson interferometer and special materials having a particularly high Verdet constant.

The present invention recognizes a fourth phenomena that affects temperature dependence of current sensing, that of an actual change in the effective angle between the input and output PZ fibers during temperature cycling, which has not heretofore been appreciated. Although this change is very small (on the order of 0.3° in a well designed sensor), it nevertheless can adversely affect the response of a sensor over widely varying temperatures. The sensor's apparent response to current is proportional to $\tan(\Omega)$, where $\Omega$ is the angle between the input and output polarizers in the presence of no electrical current or any magnetic field. Hereinafter $\Omega$ is referred to as the bias angle; $\Omega$ is typically ±45° corresponding to $\tan(\Omega)=\pm 1$, where a negative value indicates that the optical response is 180° out of phase with an applied AC current. An apparent change in the bias angle may be caused by many effects, some but not all examples of these are: physical rotation of the input or output polarizer or the sensing element; the so-called Berry's phase which is an apparent circular birefringence attributable to the sensing coil shape; circular birefringence in the sensing fiber; or a DC magnetic field or current. It would, therefore, be desirable to devise a method and apparatus to overcome both Verdet constant variations and the apparent change in bias angle brought on by temperature variations. It would be further advantageous if such an apparatus were to simplify the detector assembly portion of the sensor rather than requiring additional components.

SUMMARY OF THE INVENTION

The present invention provides a fiber optic, Faraday effect current sensor generally comprising a light source, a Faraday effect sensing coil having an input, an output, and a temperature-dependent Verdet constant, first means for coupling the light source to the input of said sensing coil such that a linearly polarized signal may be transmitted to the input, an optical detector, and second means for coupling the output of the sensing coil to the optical detector, the second coupling means including means compensating for changes in the sensitivity of the sensing coil caused by temperature-induced variations of the Verdet constant. The sensing coil exhibits temperature-induced changes in its sensitivity due to a change in its bias angle, and the second coupling means compensates for the temperature-induced variations of the Verdet constant by offsetting the variations against the sensitivity changes caused by the bias angle change. The second coupling means includes a polarizing (PZ) fiber having first and second ends, the first end being coupled to the output of the sensing coil with a primary axis of the PZ fiber aligned with a preferred channel of the output associated with the sensitivity changes caused by the bias angle change, and the second end being coupled to the detector.

If the light source is depolarized, the first coupling means includes a single-mode fiber having first and second ends, and a PZ fiber having first and second ends, the first end of the single-mode fiber being coupled to the light source, the second end of the single-mode fiber being spliced to the first end of the PZ fiber, and the second end of the PZ fiber being coupled to the input of the sensing coil. If the light source is polarized the first coupling means includes a first fiber having first and second ends, the first fiber being a PZ fiber, a second fiber having first and second ends, the second fiber being either a PZ fiber or a polarization maintaining (PM) fiber, and a third fiber having first and second ends, the third fiber being a PZ fiber, with the first end of the first fiber being coupled to the light source, the second end of the first fiber being spliced to the first end of the second fiber, the second end of the second fiber being spliced to the first end of the third fiber, and the second end of the third fiber being coupled to the input of the sensing coil. The light source is preferably non-coherent, and most preferably a superluminescent diode.

The method described herein reduces the change in current sensitivity as a function of temperature. By exploiting the change in sensitivity due to the material effects of the Verdet constant, in conjunction with temperature dependent changes in the bias angle, a flatter response relative to the material limit response is obtained. The sensor may be fabricated by splicing a length of PM fiber to the output of the sensing coil with the axes of the PM fiber biased at a 45° angle relative to the axis of the PZ fiber at the input of the sensing coil. A polarizing beam splitter is used to separate the light traveling on the fast axis of the PM fiber from light traveling on the slow axis of the PM fiber. One of these axes will be aligned at a +45° bias angle, hereinafter referred to as channel 1, and the other will be aligned at a −45° bias angle, hereinafter referred to as channel 2. These channels are differentiable by measuring the phase of each channel with respect to an applied AC current. The sensor is then temperature cycled while both channels are monitored. As the angle between the input PZ and output PM axes changes by a small amount, Δ(T) (the functional dependence on T indicates the change is temperature dependent), the response of channel 1 to current will change from +1 to tan(45°+Δ(T)), and the response of channel 2 to current will change from −1 to tan(−45°+Δ(T)). If the change in bias angle Δ(T) has a positive slope with respect to temperature changes, channel one will have an increased response to current and channel 2 will have a decreased response to current. The temperature dependence of the Verdet constant in fused silica at typical fiber optic wavelengths (700 nm to 1500 nm) causes an increased sensor response to current with temperature. The combined effects of the sensor's response to current due to the changes in Verdet constant and bias angle will cause (in this example) channel 1 to have a greater deviation from a constant temperature value than channel 2. The channel which demonstrates the best compensation to Verdet constant change is noted. piece of PZ fiber is then attached to the free end of the PM fiber, aligned to transmit the preferred channel to the detector. The resulting fiber optic current sensor has an improved temperature response and requires only a single detector, as opposed to the dual detector systems of the prior art. Alternatively, if multiple sensors are constructed with the same design, it is possible to show the bias angle change always has the same response to temperature for a given sensor package design. In this case, it is possible to empirically determine which channel has the least temperature response (i.e., the channel biased at +45° or −45°), and the intermediate step of using a PM fiber to measure the different channel responses can be eliminated and a PZ output fiber simply spliced to the sensing coil at the appropriate angle.

BRIEF DESCRIPTION OF THE DRAWINGS

The invention will best be understood by reference to the accompanying drawings, wherein:

FIG. 1 is a diagram of a prior art fiber optic current sensor;

FIG. 2 is a diagram of one embodiment of the fiber optic current sensor according to the present invention;

DESCRIPTION OF THE PREFERRED EMBODIMENT

Figure 3:
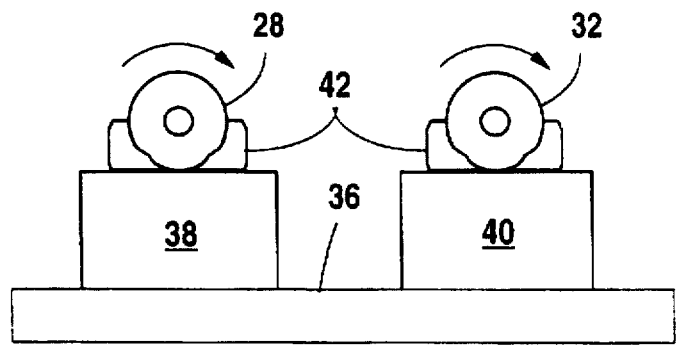
FIG. 3 is an elevational view illustrating physical rotation of fibers in the sensor of the present invention, due to temperature variation.

With reference now to the figures, and in particular with reference to FIG. 2, there is depicted one embodiment of the fiber optic current sensor (FOCS) 20 of the present invention. FOCS 20 is generally comprised of a light source 22 coupled to a first optical fiber 24, which is spliced to a second optical fiber link 26, which in turn is spliced to a third, PZ fiber 28. PZ fiber 28 is connected to the input of a fiber sensing coil 30. The output of coil 30 is spliced to another PZ fiber 32 aligned to the predetermined, favored bias angle, and which is fed into a single detector 34.

The sensing coil is preferably annealed and contained within a ceramic structure to minimize thermal stresses over varying temperatures. The input and output polarizing fibers are aligned relative to one another at the preferred bias angle so as to transmit the preferred channel. These fibers are secured to quartz plates at this angle by the method shown in FIG. 3. These fibers are then fusion spliced to the sensing coil and the quartz plates attached to the ceramic structure as also shown in FIG. 3. The splice connections of both the input and output of the sensing coil are preferably maintained in parallel in the same ceramic structure with the splice point of the input and output being as close to each other as possible. The remaining PZ or PM fibers are then coiled up together (preferably, wound in the same direction) and stored in a plane parallel and adjacent to the sensing coil (preferably, in a slightly larger diameter). Lengths of these fiber are then allowed to exit the package for coupling to the source and detector.

Light source 22 may be a laser, but it is preferably a non-coherent source, such as a super-luminescent diode (SLD), in order to minimize coherence effects, such as interference patterns which might affect the optical signal. As with the prior art system, if a polarized light source is used, fiber 24 is a PZ or PM fiber, and fiber 26 may be either a PZ or PM fiber. PZ fiber is preferred over PM fiber for its operating characteristics, but PM fiber is less expensive and may be adequate for most applications. If a depolarized laser source is used, fiber 24 may be a depolarizer and fiber 26 may simply be a single-mode fiber. PZ fiber 28 is preferably 7–10 m long to provide a suitable, linearly polarized signal for the input to coil 30. Coil 30 may be annealed, or unannealed (e.g., flint glass). Annealing, along with certain other fiber spinning techniques, may be used to minimize the birefringence of the coil to reduce related temperature effects, as discussed in U.S. patent application Ser. No. 08/205,880, now U.S. Pat. No. 5,492,552, which is incorporated by reference. The coil may be contained in a helical holder formed of silica, as taught in U.S. Pat. No. 08/205, 899, now U.S. Pat. No. 5,463,312, also incorporated by reference.

FOCS 20 differs from the prior art sensor of FIG. 1, among other ways, in that it requires only a single detector 34, and does not require a polarizing beam splitter. Temperature compensation for changes in the Verdet constant is accomplished by aligning a preselected channel of the output of coil 30 with the axis of PZ fiber 32, as explained above. The present invention recognizes that a change in bias angle may take place during temperature cycling, and takes advantage of this phenomena to compensate for Verdet constant drift. One possible cause of this change may be physical rotation of the input and output PZ fibers which are in this case secured as shown in FIG. 3. The input and output ends 28 and 32 of sensing coil 30 are secured to a substrate 36, such as by adhering them to mounting blocks 38 and 40, respectively, using an adhesive 42, with blocks 38 and 40 being attached to substrate 36 by any convenient means, such as by gluing. As the current sensor is temperature cycled, there may be an effective rotation of either the coil fiber with respect to the attached PZ fibers, or a rotation of the PZ fibers with respect to the coil input and output. This effect can be manifested by a physical rotation due to one or all of the components moving because of thermal expansion of adhesives or other packaging materials. Also, the effective rotation can be induced by other optical effects such as circular birefringence, or Berry's phase phenomena which is a change of polarization in the coil if a spring-like movement occurs. Experimentation shows that the bias angle change consistently occurs in the same direction (i.e., all the time) for a given package design.

Figure 4:
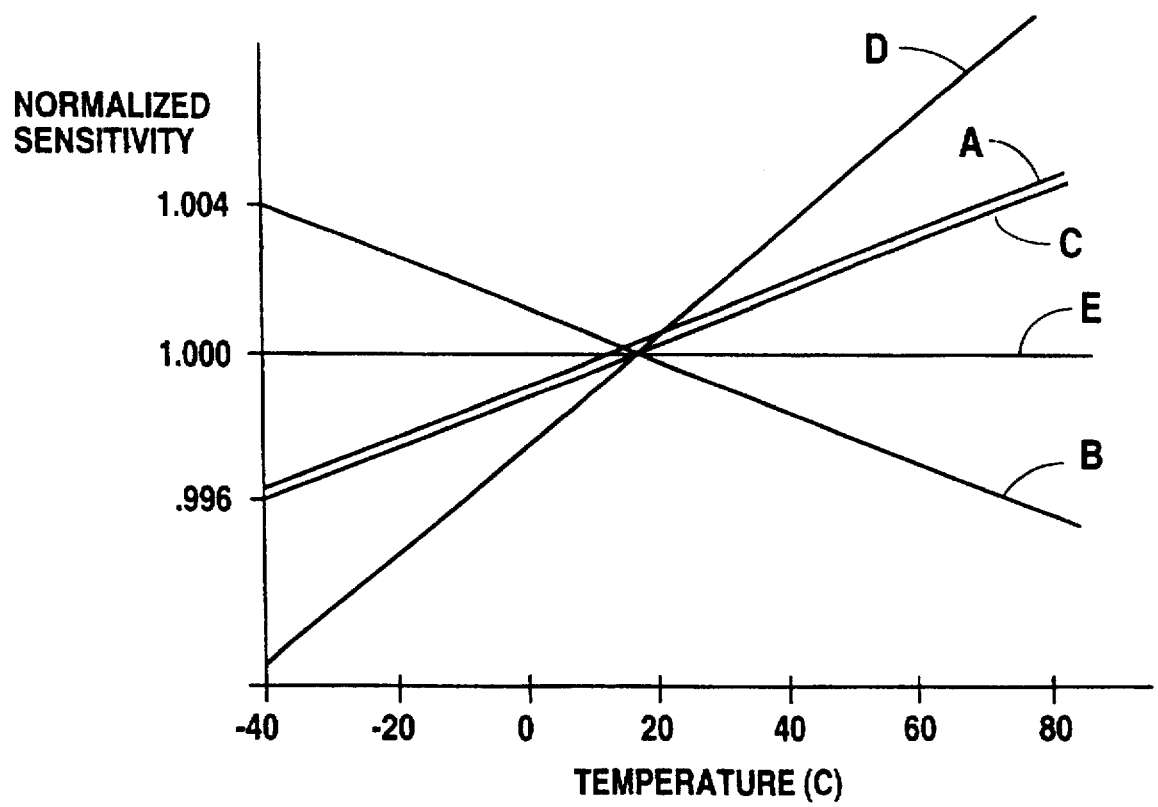
FIG. 4 is a graph depicting the normalized sensitivity of a sensor and the associated Verdet constant as a function of temperature.

This change in bias angle between the input and output polarizer results in a change in the sensitivity of the sensor. The change, however, is different for the two channels of coil 30, that is, the two axes of the fiber which are ±45° off of the primary axis defined by the input signal. As illustrated in FIG. 4, the sensitivity will increase along one of these channels as shown by line A, and will decrease along the other channel as shown by line B. This is a result of the device's response to current, which varies according to the equation $(\gamma I/\gamma \Omega)/I=\tan(\Omega)$, where I is the current and $\Omega$ is the bias angle. FIG. 4 also depicts the variation of the Verdet constant. The expression for the change of the Verdet constant is essentially linear over the temperature range of interest, and has a slope of about $6.9\times10^{-5}$/C as shown by line C. If the change in sensor response due to a change in bias angle can be made to oppose the change in sensor response due to the Verdet constant function, then a much flatter overall response to temperature can be obtained. Alignment of the axis of PZ fiber with channel A results in worsened sensitivity, indicated by line D, while alignment of the axis of PZ fiber with channel B results in a practically flat response, i.e., nearly completely counteracting the two effects, indicated by line E.

Determination of which of the two channels is the appropriate one for Verdet constant compensation is empirical, for a given assembly construction. The sensor may be fabricated by splicing a length of PM fiber to the output of the sensing coil with the axes of the PM fiber biased at a 45° angle relative to the axis of the PZ fiber at the input of the sensing coil. A polarizing beam splitter is used to separate the light traveling on the fast axis of the PM fiber from light traveling on the slow axis of the PM fiber. One of these axes will be aligned at a ±45° bias angle (channel 1), and the other will be aligned at a –45° bias angle (channel 2). These channels are differentiable by measuring the phase of each channel with respect to an applied AC current. The sensor is then temperature cycled while both channels are monitored. As the angle between the input PZ and output PM axes changes by a small amount, $\Delta(T)$, the response of channel 1 to current will change from +1 to $\tan(45°+\Delta(T))$, and the response of channel 2 to current will change from –1 to $\tan(-45°+\Delta(T))$. If the change in bias angle $\Delta(T)$ has a positive slope with respect to temperature changes, channel one will have an increased response to current and channel 2 will have a decreased response to current. The temperature dependence of the Verdet constant in fused silica at typical fiber optic wavelengths (700 nm to 1500 nm) causes an increased sensor response to current with temperature. The combined effects of the sensor's response to current due to the changes in Verdet constant and bias angle will cause (in this example) channel 1 to have a greater deviation from a constant temperature value than channel 2. The channel which demonstrates the best compensation to Verdet constant change is noted. A piece of PZ fiber is then attached to the free end of the PM fiber, aligned to transmit the preferred channel to the detector. The resulting fiber optic current sensor has an improved temperature response and requires only a single detector, as opposed to the dual detector systems of the prior art. Alternatively, if multiple sensors are constructed with the same design, the bias angle change will generally have the same response to temperature for a given sensor package design. In such a case, it is possible to empirically determine which channel has the least temperature response (i.e., the channel biased at +45° or –45°), and the intermediate step of using a PM fiber to measure the different channel responses can be eliminated and a PZ output fiber simply spliced to the sensing coil at the appropriate angle.

The preferred types of fibers used with the present invention are available from 3M Specialty Optical Fibers in West Haven, Conn. PM fiber is available under part number FS-PM-4611/200SA (operating wavelength 820 nm), and PZ fiber is available under part number FS-PZ-4611/200SA (operating wavelength 850 nm). The fiber which was annealed into coil 30 is FS-SM-4611 (operating wavelength 780 nm). This may also be used for the single-mode fiber from the laser light source. Blocks 38 and 40 are preferably quartz plates formed from microscope slides and cut into ⅛"×½"×1 mm pieces. Alumino-silicate substrate 36 was procured from AC Technologies of Yonkers, N.Y., under part number ACMA-1100. A suitable glue 42 used to adhere the fibers is the UV cured epoxy NOA #72 from Norland Products of New Brunswick, N.J. A suitable glue for adhering blocks 38 and 40 to plate 36 is available from Electronic Materials of Danbury, Conn., under part number XP1060-930-45-1A. A laser diode optical package for light source 22 was obtained from Point Source Ltd. of Winchester, England, under part number LDS-Pz-3-K-780-0.5-TE. The alternative super-luminescent diode contained in the Point Source Ltd. package was manufactured by EG&G Opto-electronics of Vaudreuil, Canada. The preferred detector 34 is the Si photo-detector model number 260 from Graseby Optronics of Orlando, Fla.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A device for detecting change in any electrical current flowing through a conductor, the device comprising:

a light source;

a Faraday effect sensing coil having an input, an output, and a temperature-dependent Verdet constant;

first means for coupling said light source to said input of said sensing coil such that a linearly polarized signal may be transmitted to said input;

an optical detector; and second means for coupling said output of said sensing coil to said optical detector, said second coupling means including means compensating for changes in the sensitivity of said sensing coil caused by temperature-induced variations of said Verdet constant.

2. The device of claim 1 wherein said light source is non-coherent.

3. The device of claim 1 wherein:

said sensing coil further exhibits temperature-induced changes in its sensitivity due to a change in its bias angle; and said second coupling means compensates for temperature-induced variations of said Verdet constant by offsetting said variations against said sensitivity changes caused by said bias angle change.

4. The device of claim 1 wherein said second coupling means includes a polarizing (PZ) fiber having first and second ends, said first end being attached to said output of said sensing coil and said second end being coupled to said detector.

5. The device of claim 1 wherein:

said light source is depolarized; and said first coupling means includes a single-mode fiber having first and second ends, and a polarizing (PZ) fiber having first and second ends, said first end of said single-mode fiber being coupled to said light source, said second end of said single-mode fiber being spliced to said first end of said PZ fiber, and said second end of said PZ fiber being coupled to said input of said sensing coil.

6. The device of claim 1 wherein:

said light source is polarized; and said first coupling means includes a first fiber having first and second ends, said first fiber being a polarizing (PZ) fiber, a second fiber having first and second ends, said second fiber being either a PZ fiber or a polarization maintaining (PM) fiber, and a third fiber having first and second ends, said third fiber being a PZ fiber, said first end of said first fiber being coupled to said light source, said second end of said first fiber being spliced to said first end of said second fiber, said second end of said second fiber being spliced to said first end of said third fiber, and said second end of said third fiber being coupled to said input of said sensing coil.

7. The device of claim 2 wherein said light source is a super-luminescent diode.

8. The device of claim 3 wherein said second coupling means includes a polarizing (PZ) fiber having first and second ends, said first end being coupled to said output of said sensing coil with a primary axis of said PZ fiber aligned with a preferred channel of said output associated with said sensitivity changes caused by said bias angle change, and said second end being coupled to said detector.

9. A fiber optic current sensor comprising:

a non-coherent light source;

a Faraday effect sensing coil having an input, an output, a temperature-dependent Verdet constant, and a bias angle, said sensing coil further exhibiting temperature-induced changes in its sensitivity due to changes in its bias angle;

first means for coupling said light source to said input of said sensing coil such that a linearly polarized signal may be transmitted to said input;

an optical detector; and second means for coupling said output of said sensing coil to said optical detector, said second coupling means including means compensating for changes in the sensitivity of said sensing coil caused by temperature-induced variations of said Verdet constant by offsetting said variations against said sensitivity changes caused by said bias angle change.

10. The device of claim 9 wherein said second coupling means includes a polarizing (PZ) fiber having first and second ends, said first end being attached to said output of said sensing coil and said second end being coupled to said detector.

11. The device of claim 10 wherein said first end of said PZ fiber is coupled to said output of said sensing coil with a primary axis of said PZ fiber aligned with a preferred channel of said output associated with said sensitivity changes caused by said bias angle change.

12. The device of claim 11 wherein said light source is a super-luminescent diode.

13. The device of claim 11 wherein:

said light source is depolarized; and said first coupling means includes a single-mode fiber having first and second ends, and a second PZ fiber having first and second ends, said first end of said single-mode fiber being coupled to said light source, said second end of said single-mode fiber being spliced to said first end of said second PZ fiber, and said second end of said second PZ fiber being coupled to said input of said sensing coil.

14. The device of claim 11 wherein:

said light source is polarized; and said first coupling means includes a first fiber having first and second ends, said first fiber being a PZ fiber, a second fiber having first and second ends, said second fiber being either a PZ fiber or a polarization maintaining (PM) fiber, and a third fiber having first and second ends, said third fiber being a PZ fiber, said first end of said first fiber being coupled to said light source, said second end of said first fiber being spliced to said first end of said second fiber, said second end of said second fiber being spliced to said first end of said third fiber, and said second end of said third fiber being coupled to said input of said sensing coil.

15. A method of assembling a fiber optic current sensor, comprising the steps of:

obtaining a Faraday effect sensing coil having an input, an output, and a temperature-dependent Verdet constant;

coupling a light source to said input to provide a linearly polarized signal to said input; and coupling an optical detector to said output such that any optical signal received by said detector is compensated for changes in the sensitivity of said sensing coil caused by temperature-induced variations of said Verdet constant.

16. The method of claim 15 wherein said step of coupling said optical detector to said output is accomplished by:

determining a preferred channel of said output associated with changes in the sensitivity of said sensing coil caused by temperature-induced changes in its bias angle;

coupling a first end of a polarizing (PZ) fiber to said output of said sensing coil with a primary axis of said PZ fiber aligned with said preferred channel; and coupling a second end of said PZ fiber to said detector.

17. The method of claim 16 wherein said determining step is accomplished by:

attaching a first end of a polarization maintaining (PM) fiber to said output of said sensing coil;

attaching a second end of said PM fiber to a polarizing beam splitter having two outputs coupled to two optical detectors, respectively; and monitoring said two optical detectors to identify said preferred channel.

18. The method of claim 17 further comprising the steps of:

removing said polarizing beam splitter from said second end of said PM fiber; and attaching said PZ fiber to said PM fiber with said primary axis of said PZ fiber aligned with said preferred channel.

19. The method of claim 17 wherein the fiber optic current sensor has a package design which is essentially identical to a package design of a preexisting fiber optic current sensor, and said determining step is accomplished by identifying a preferred channel associated with said package design of said preexisting fiber optic current sensor.

20. The method of claim 18 wherein the fiber optic current sensor has a package design which is essentially identical to a package design of a preexisting fiber optic current sensor, and said determining step is accomplished by identifying a preferred channel associated with said package design of said preexisting fiber optic current sensor.

* * * * *